(12) United States Patent
Sir

(10) Patent No.: US 7,365,007 B2
(45) Date of Patent: Apr. 29, 2008

(54) INTERCONNECTS WITH DIRECT METALIZATION AND CONDUCTIVE POLYMER

(75) Inventor: Jiun Hann Sir, Penang (MY)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 10/882,468

(22) Filed: Jun. 30, 2004

(65) Prior Publication Data

US 2006/0003579 A1     Jan. 5, 2006

(51) Int. Cl.
*H01L 21/4763*     (2006.01)

(52) U.S. Cl. .............. 438/644; 438/654; 438/675; 257/E21.584

(58) Field of Classification Search ............. 427/96.1; 83/929.1; 174/256; 438/677
See application file for complete search history.

(56) References Cited

U.S. PATENT DOCUMENTS

| | | | |
|---|---|---|---|
| 5,183,552 A * | 2/1993 | Bressel et al. | 205/158 |
| 5,334,488 A * | 8/1994 | Shipley, Jr. | 430/315 |
| 6,534,723 B1 * | 3/2003 | Asai et al. | 174/255 |

* cited by examiner

*Primary Examiner*—Stephen W. Smoot
(74) *Attorney, Agent, or Firm*—Blakely, Sokoloff, Taylor & Zafman LLP

(57) ABSTRACT

Embodiments include an interconnect or trace of electrically conductive material with a contact surface, and a dielectric layer overlying the contact surface with a via formed on the dielectric layer and to the contact surface. The via sidewalls and perimeter are layered with a manganese oxide ($MnO_2$) layer which is layered over with a conductive polymer material. An interconnect material is formed in the via and in a trench above the perimeter of the via such that the interconnect material is on the conductive polymer material and contacts the contact surface. An additional dielectric layer may be formed over the interconnect material and an additional via may be formed therethrough so that an additional structure having a $MnO_2$ layer, conductive polymer material, and interconnect material can be formed in the additional via and to the interconnect material.

16 Claims, 6 Drawing Sheets

INTERCONNECTS WITH DIRECT METALIZATION AND CONDUCTIVE POLYMER

BACKGROUND

1. Field

Robust stacked via in substrate and printed circuit board ("PCB"), more particular the use and manufacturing of a stack via interconnect that prevents delamination.

2. Background

As the size of semiconductor devices decreases, the density of the circuit elements on the semiconductor device increases, and the interconnect density within the substrate and printed circuit board ("PCB") increases. In order to achieve high density interconnect in the limited space, vias at different layer may be stacked together in a column structure. In substrate and PCB, multiple interconnect layers may be fabricate so that the conductive interconnect layers are separated by dielectric layers. A stacked via in a semiconductor substrate or PCB provides an electrical connection between conductors on different layers of the substrate and PCB. During manufacturing, packaging, attachment, rework and use condition, the stack via interconnect may experience thermal variation and vertical tensile strain due to the mismatch of coefficient of thermal expansion ("CTE") between stack via interconnect, dielectric and conductor. Therefore, it is desirable to manufacture a stack via that can avoid being damage or delaminating within the column structure which if broken could lead to electrical failure.

DETAILED DESCRIPTION

Integrated circuits typically use a substrate, circuit device, printed circuit board (PCB), or "package" (e.g., such as a device for electrically connecting an electronic device to a PCB) having conductive interconnections or traces to connect multiple electronic devices, integrated circuits (IC), and/or silicon "chips" (e.g., such as a diced piece of a silicon wafer having electronic devices thereon), such as to send and/or receive signals external therebetween. Currently, popular types of interconnections or traces include aluminum alloy interconnections (lines) and copper interconnections (lines) coupled to individual devices, including other interconnections (lines) by interconnections, for example, through vias. A typical method of forming an interconnection or trace, particularly a copper interconnection or trace, involves forming a via in a dielectric material layer to an underlying interconnection or trace, and then forming an interconnect or trace on the dielectric layer or commonly in a trench in the dielectric layer.

Figure 1:
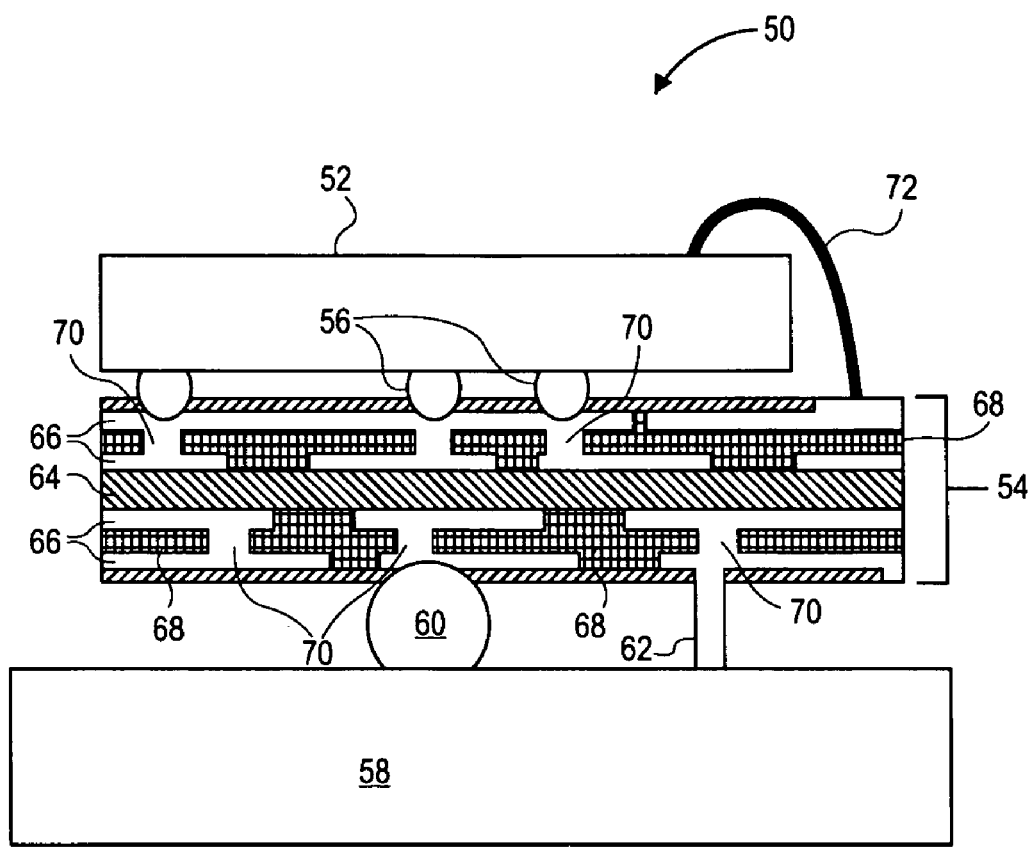
FIG. 1 is side cross section view of an integrated circuit assembly in which an embodiment of the present invention may be used.

FIG. 1 is a side cross section view of an integrated circuit assembly 50 in which an embodiment of the present invention may be used. A silicone die 52 may be connected to a substrate 54 by solder ball 56 or wire bonding 72. The substrate 54 may be connected to a printed circuit board 58 by connector such as solder ball 60 or pin 62. The substrate 54 may have a core 64, conductive layer 66, and dielectric material 68 separating the conductive layer 66. In the illustrated example, the substrate 54 has a core 64 and multilayer conductive layer 66 on both the top and bottom of core 64. The conductive layers 66 may comprise of copper. The multilayer dielectric insulates the conductive layer 66 from each other. Stack vias 70 provide electrical connections between different conductive layer 66 that are separated by dielectric material 68.

Figure 2:
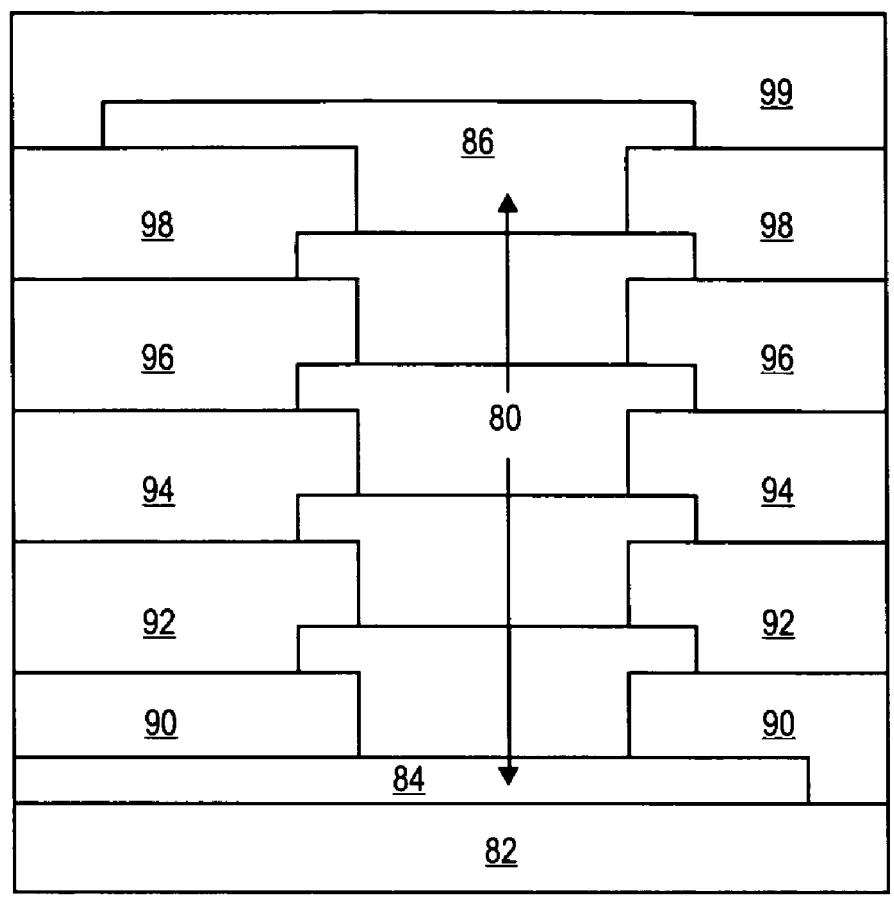
FIG. 2 is the side cross section view providing more details of an embodiment of a stack via.

FIG. 2 is a side cross section view to provide more detail of an embodiment of stack via 80, such as might be used as one of the vias 70 in the integrated circuit assembly 50 of FIG. 1. There may be a first dielectric layer 82. In various embodiments, this first dielectric layer 82 may comprise a resin composite material, such as glass fiber in a hydrocarbon/ceramic matrix, glass fiber in a thermoset polyester matrix, a resin material, such as epoxy, an epoxy-acrylate mixed resin, or other materials. In an embodiment, the first dielectric layer 82 is approximately 30 mm thick, although it may have other thickness in other embodiments. Over at least part of the first dielectric layer 82 may be a bottom conductor. Bottom conductor 84 may be copper in some embodiments, and may also other conductive materials such as aluminum or nickel in other embodiments. Bottom conductor 84 may be a conductive trace, a conductive plane or another conductor. In an embodiment, the bottom conductor 84 may have a thickness in range of 15 micrometer to about 25 micrometer, although it may have a different thickness in other embodiments. Above the bottom conductor is a multilayer of dielectric layers 90, 92, 94, 96, 98, and solder resist 99. Dielectric layers 90, 92, 94, 96, and 98 may comprise of a resin composite material such as silica filler reinforce epoxy resin or mixed resin or other materials. In an embodiment, the second dielectric layers 92, 94, 96, and 98 may be approximately 30 micrometer thick, although they may have other thickness in other embodiments. The dielectric layers 90, 92, 94, 96, and 98 may separate bottom conductor 84 from top conductor 86. Top conductor 86 may be copper in some embodiment and may also be other conductive materials such as aluminum or nickel in other embodiments. Top conductor 86 may be a conductive trace, a conductive plane or another conductor. In an embodiment, the top conductor may have a thickness in a range from about 15 micrometer to about 25 micrometers, although it may have a different thickness in other embodiments. The stack via 80 may extend from the top conductor 86, through the multilayer dielectric 90, 92, 94, 96, and 98 to bottom conductor 84 forming a column structure. In the embodiment, the column structure of stack via 82 was built purely using electrolytic copper in stack via 80 without having electrolytic/electroless copper interfaces that may be susceptible to delamination in conventional stacked via.

Figure 3:
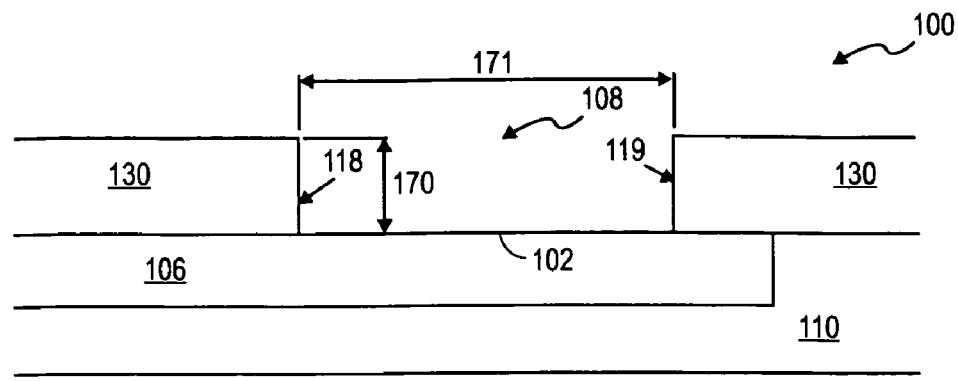
FIG. 3 is a schematic cross-section view of a circuit structure.

FIG. 3 is a schematic cross-section view of a circuit structure. For example, FIG. 3 shows structure 100 having circuit 106 formed on or in dielectric material 110. FIG. 3 also shows dielectric material 130 formed on, over, or overlying dielectric material 110 and/or circuit 106.

Structure 100 may be part of a typical such as substrate 50 or PCB 58 as shown substrate in FIG. 1, electronics "board" (e.g., such as a planar board for mounting electrical components or modules), computer board, "motherboard", circuit device, package, integrated circuit structure package, or semiconductor electronic device package to be electrically connected to a processor, microprocessor, digital signal processor, transistor, memory, central processing unit (CPU), silicon chip, or other electronic component. A typical board, electronic device, or package to connect to a microprocessor chip may have, for example, eight or twelve interconnection layers or levels separated from one another by dielectric material.

Specifically, for instance, structure 100 may include one or more electronic devices or transistors, thereon, as well as one or more levels of interconnection to those electronic devices. Thus, structure 100 may be a substrate having a thickness between 30 micrometers (μm) and 800 μm in thickness. Although the thickness may different for different designs.

FIG. 3 shows dielectric material 110 such as a dielectric or core material of a substrate, board or PCB. Dielectric material 110 may be formed, for example, by lamination (film type), coating (liquid type) or pre-form type. Moreover, dielectric material 110 may be or include one or more of an composite materials, a hydrocarbon/ceramic filler/woven glass fiber, a thermoset polyester/woven glass fiber, a polyphenylene oxide (PPO)+special resin/woven glass fiber, a bismaleimide triazine (BT)/epoxy resin/expand PolyTetraFlouroEthylene (PTFE), an epoxy resin/filler/expand PTFE.

FIG. 3 shows circuit 106 having contact surface 102 in dielectric 130 or an opening therein. Circuit 106 may be part of, may be an interconnection line or trace or plane, or may be part of an electronic device as described above with respect to structure 100. For example, vias may be formed in dielectric material 130 between circuit 106 and contacts on the other side of dielectric material 110 (e.g., such as contacts below or under circuit 106).

Circuit 106 may be an electrically conductive interconnection line or trace or plane formed in, on, overlying, or over dielectric 110. It is to be appreciated that circuit 106 may be formed by electrolytic plating or electroless follow by electrolytic plating an electrically conductive material, such as an interconnect or trace material to form an electronic interconnect or trace structure on or in dielectric 110. Moreover, in accordance with embodiments, circuit 106 may be formed of various materials including one or more of a metal, a copper, a copper alloy, an aluminum, a nickel, a gold, a silver, a platinum or a palladium material. It is also contemplated that the material of circuit 106 may be doped (e.g., such as with catalytic metals), annealed, or radiated with some form of energy to form an alloy.

In addition, FIG. 3 shows dielectric material 130 on, overlying, or over dielectric material 110 and/or circuit 106. Dielectric material 130 may be formed such as by laminating, pressing, hot pressing, heating, baking, pre-curing, and curing. Also, dielectric material 130 may include any or a combination of anjinomoto build up film (ABF), ABF-SH, ABF-GX, interpenetrate network (IPN), an epoxy, a resin, an epoxy resin, a epoxy/phenol novolac resin, a epoxy-acrylate photosensitive, and a thermoset cycloolefin/epoxy resin. It is also contemplated that dielectric material 130 may be a material such as is described above with respect to dielectric material 110. Dielectric material 130 may have a top surface oriented parallel to a top surface of dielectric 110 and/or circuit 106. When initially formed, dielectric 130 may be formed on or cover contact surface 102.

FIG. 3 also shows via opening 108 having via sidewalls 118 and 119 extending from a top surface of via opening 108 to contact surface 102. Via opening 108 may be an opening defining various surface area shapes with respect to dielectric 130. For example, via opening 108 may be circular, oval, square, rectangular, triangular, hexagonal, or another appropriate shape for providing a sufficient opening for electrically conductive material to be formed on contact surface 102. Notably, via opening 108 may have one or more via sidewalls (e.g., such as by having one sidewall where via opening 108 defines a circle and having four via sidewalls where via opening 108 defines a square).

According to embodiments, via opening 108 may be formed by removing a portion of dielectric 130 to form an opening as described above. For example, a portion of dielectric 130 may be removed by drilling, evaporating, carbon dioxide ($CO_2$) laser, ultraviolet (UV) laser, or etching.

According to embodiments, via opening 108 may have depth 170 between 15 μm and 30 μm, such as by having a depth of 17.5 μm, 20 μm, and 25 μm. Similarly, via opening 108 may have a width/length or diameter 171 of between 30 μm and 100 μm, such as by having or forming an opening in the surface of dielectric 130 that includes a diameter of 40 μm, 50 μm, 60 μm, 70 μm, 80 μm, or 90 μm. However the depth and diameter of via opening may vary time to time base on different design need and advancement of via opening forming equipment or tool or chemical etch recipe.

Thus, it is considered that via opening 108 may expose all or a portion of contact surface 102 of circuit 106. Specifically, via opening 108 may expose a sufficient surface area of contact surface 102 to form an electrically conductive connection with an interconnect material formed in via opening 108.

Figure 4:
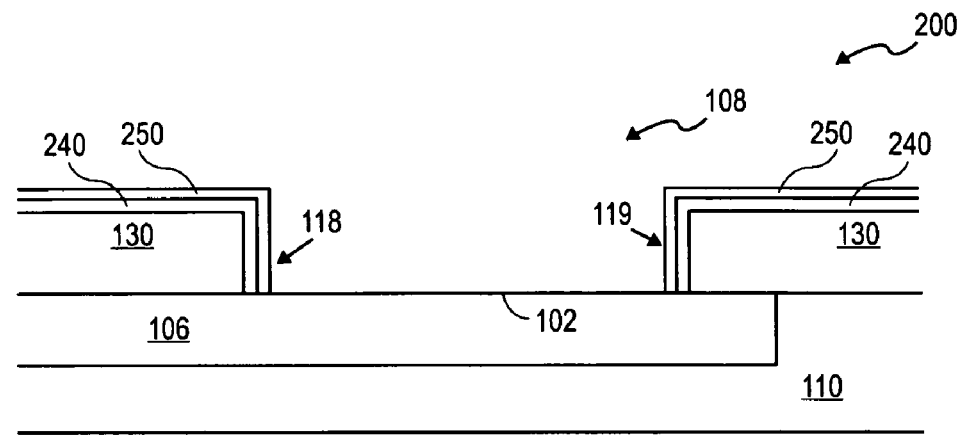
FIG. 4 shows the structure of FIG. 3 after forming a layer of manganese oxide ($MnO_2$) on the dielectric surface and forming a layer of conductive polymer on the layer of $MnO_2$.
Figure 5:
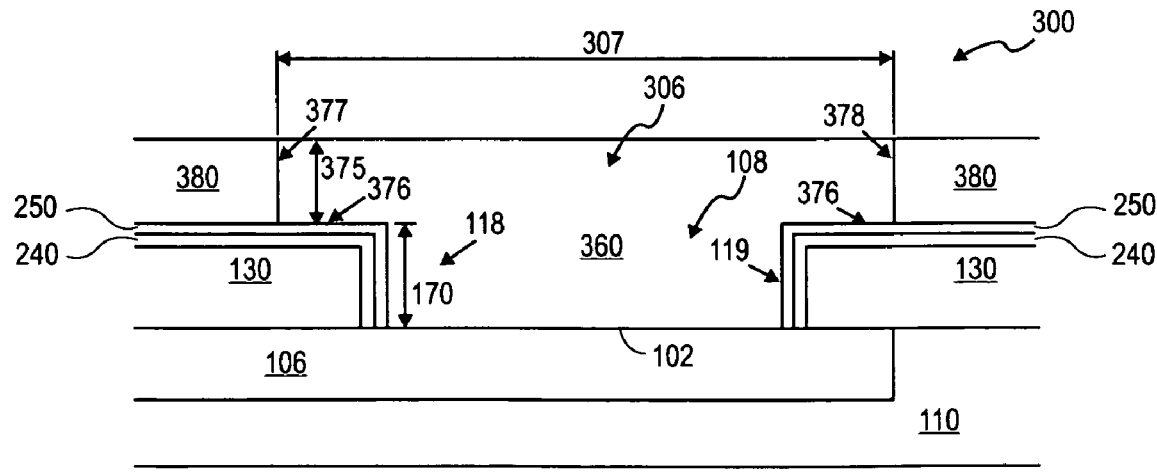
FIG. 5 shows the structure of FIG. 4 after forming a layer of photoresist over the conductive polymer, the photoresist having a trench opening, and showing the via and trench opening filled with an interconnect material.

FIG. 4 shows the structure of FIG. 3 after forming a layer of manganese oxide ($MnO_2$) on the dielectric surface and forming a layer of conductive polymer on the layer of $MnO_2$. FIG. 5 shows manganese oxide ($MnO_2$) layer 240 formed on, in, of, at, from, and/or over dielectric material 130, such as on a surface of dielectric material 130 including in or on via sidewalls 118 and 119, and to, but not on contact surface 102. For example, $MnO_2$ layer 240 may be formed by permanganate etching a thickness of dielectric 130 material sufficiently to oxidize covalent bonds in the thickness of the dielectric material. In such a process, the permanganate solution may oxidize covalent bonds within a polymer network of dielectric 130, such as where dielectric 130 is an epoxy, a resin, an epoxy resin, and ABF or another material as described above for dielectric 130. For instance, dielectric 130 may be treated with a bath, including a concentration of permanganate, heated to 160° F. or more for a dwell time of from 5 to 20 minutes to cause the $MnO_2$ layer to form as the permanganate solution degrades due to a deoxidizing process, such as a process of oxidizing dielectric 130. Thus, layer 240 may include an oxidized thickness of dielectric material 130 that includes via sidewalls 118 and 119 as well as the surface of dielectric material 130 extending along a perimeter of via hole 108 and beyond the perimeter of via hole 108, such as is shown in FIG. 4.

According to embodiments, a layer of conductive polymer may be formed on, over, or overlying the $MnO_2$ layer. For example, FIG. 4 shows conductive polymer material 250 formed on $MnO_2$ layer 240. Conductive polymer material 250 may be formed such as by using $MnO_2$ layer 240 as a catalyst to form, attach, bond, or join dissolved monomers to form a conductive polymer material to the $MnO_2$ layer. Using such a process, when enough monomers are joined or attached to the $MnO_2$ layer, the monomers may polymerize, such as to form a solid conductive polymer material on or deposited on the $MnO_2$ layer. In one example, pyrro in monomer form is joined with the catalyst $MnO_2$ layer to form a polymer which is polypyrrole. When the monomers on the catalyst $MnO_2$ layer begin to join or attach to each other, they form macromolecules, which can no longer maintain solubility in solvent, and thus form, attach to, or deposit on the $MnO_2$ layer surface as a solid material.

It is to be appreciated that the conductive polymer material may be formed on the surface of $MnO_2$ layer 240 along via sidewalls 118 and 119, along a perimeter of via opening 108, and beyond the perimeter of via opening 108, such as is shown in FIG. 4. For instance, conductive polymer material 250 may include a conformal and polymerized layer of a solid conductive polymer material, such as either, or a mixture of pyrroll and thiophane formed on $MnO_2$ layer 240.

It is also contemplated that conductive polymer material 250 and/or $MnO_2$ layer 240 may be doped, implanted, annealed, polished, etched, radiated, and/or experience other processing settings or treatments known in the art for forming circuit structures as described above with respect to circuit 106. It is also considered that layer 240 and/or material 250 may provide enhanced adhesion to each other as well as to structures they are formed in or on, or structures that are formed on or around those layers. In addition, layer 240 and/or material 250 may include or be selected to be a layer of material having a property tending to reduce metal diffusion and/or reduce electron migration between layers formed above and below or around those layers.

FIG. 5 shows the structure of FIG. 4 after forming a layer of photoresist over the conductive polymer, the photoresist having a trench opening, and showing the via and trench opening filled with an interconnect material. FIG. 5 shows photoresist 380 formed on or over conductive polymer material 250 and forming trench opening 306 having trench sidewalls 377 and 378, and trench base 376.

For example, to form photoresist material 380, a photoresist layer such as a dry film photoresist material, may be laminated, disposed, or formed over the surface of dielectric 130 (e.g., such as by being formed on the surface of conductive polymer material 250 disposed over dielectric 130) and may be formed over via opening 108, such as by processes known in the art. It is contemplated that the photoresist layer (e.g., such as photoresist material 380 as shown in FIG. 5) may have a thickness of between 10 μm and 30 μm, such as by having a thickness of 15 μm, 20 μm, 25 μm. The photoresist thickness may vary for different design needs.

Next, a portion of the photoresist layer (e.g., such as photoresist material 380 as shown in FIG. 5) may be exposed to light (e.g., such as ultraviolet or other appropriate light to expose the photoresist material for development) including a portion of the photoresist layer beyond or extending beyond a perimeter area or zone adjacent to via opening 108 (e.g., such as shown by photoresist material 380 of FIG. 5). Next, portions of the photoresist material may be developed, etched, and/or removed excluding the portions of the photoresist material exposed to the light. For instance, a portion of photoresist material corresponding to trench opening 306 of FIG. 5 may be removed to form trench opening 306 defining trench base 376 on dielectric 130 or conductive polymer material 250 disposed over dielectric 130, and trench sidewalls 377 and 378 of photoresist material 380. More particularly, trench opening 306 may be formed by patterning or protecting a surface area of photoresist material corresponding to trench opening 306 from UV light with a glass mask (e.g., such as a glass mask with a copper trace, plain, via opening, and/or trench opening design formed on the glass mask) placed between the UV light (e.g., such as a UV light source having a 90+/−10 mega-joule per centimeter squared (e.g., 10 mj/cm² light intensity) and the dry film. Subsequently, the dry film area exposed to the light undergoes an x-linking, and thus remains in tack on dielectric material 130 (or conductive polymer material 250 disposed over dielectric material 130) during a subsequent developing process of the dry film. Thus, after development, the dry film area protected by the glass mask from the UV light is removed to form trench opening 306.

Trench opening 306 may have depth 375 of between 10 μm and 40 μm, such as by having a depth of 15 μm, 20 m or 25 μm. Additionally, trench opening 306 may form an opening or width, such as width 307, of between 50 μm and 150 μm, such as by having a width of 60 μm, 70 μm, 80 μm, 90 μm, 100 μm or 110 μm. For example, as shown in FIG. 5, trench opening 306 has an opening size that is larger than the opening size of via opening 108, and is located with respect to via opening 108 to define or form trench base 376 around, along, and/or on both ends of the perimeter of via opening 108. Specifically, it is considered that layers 240 and 250 may exist on trench base 376.

It is also contemplated that trench opening 306 may form an opening extending into and out of the cross-section view shown in FIG. 5 for a distance equal to or greater than that described above with respect to width 307. Specifically, it is considered that trench opening 306 may extend a length into and out of the cross-section view shown in FIG. 5 sufficient to provide a trench to more than one via opening to more than one contact of an electronic circuit, such as via opening 108, such as is known in the art.

FIG. 5 also shows interconnect material 360, such as an electrically conductive material, in via opening 108 and trench opening 306, on trench base 376, and on (e.g., such as by being attached to, contacting, or being electrically coupled to) contact surface 102. Thus, interconnect material 360 may be formed in (e.g., such as by filling) via opening 108, formed on conductive polymer material 250, and formed to contact surface 102. For instance, interconnect material 360 may be formed on sidewalls 118 and 119, such as by being formed on, adjacent to, contacting, or at conductive polymer 250 disposed over sidewalls 118 and 119. Moreover, FIG. 5 shows interconnect material 360 formed in, such as by filling, trench opening 306, and on trench base 376, such as by being on conductive polymer material 350 at trench base 376.

Similarly, interconnect material 360 may be formed on, over, overlying, connected to, attached to, forming a metal to metal adhesion with, and/or electrically connected or coupled to an area of, a portion of, and/or a contact area of contact surface 102. For example, interconnection material 360 may be formed of a metal, a copper, an aluminum, a nickel, a gold, a silver, and/or another material as described above with respect to circuit device 106 or the electrically conductive material thereof. Specifically, interconnect material 360, such as copper, may be introduced by electroplating in a sufficient amount to fill the via and possible trench and complete the interconnect structure. Copper has become a popular choice of interconnection material for various reasons, including its low resistivity compared with the resistivity of aluminum or aluminum alloys.

Moreover, it is contemplated that interconnect material 360 may be the same material as, or it may include similar material as, circuit 106. Furthermore, according to embodiments, interconnect material 360 and circuit 106 may have the same, a similar, equal, or relatively close (e.g., such as by being within 2%, 3%, 5%, or 10%) grain structures, mechanical properties (e.g., such as physical material properties) and/or thermal properties (e.g., such as thermal resistance and expansion and retraction coefficients).

More particularly, circuit 106 and/or interconnect material 360 may be formed, such as be being deposited, with a similar or same electrolytic deposition process so that they form a continuous electrolytic material stack, and thus has a similar grain structure, mechanical properties, and thermal properties as described above. For instance, circuit 106 and interconnect material 360 may be deposited using the same electrolytic metal, copper, aluminum, and/or nickel deposition process to have a similar or same grain structure, mechanical properties, and thermal properties as described above. Hence, the interface, electrical connection, attachment, bonding, or coupling between circuit device 106 and interconnect material 360 resist separation or delamination during tensile strain, such as in the vertical direction, and/or changes in temperature, such as during thermal treatment, annealing, or temperatures experienced during the lifetime of the structure in which they are included. In particular, the electrical connection, attachment, or coupling between circuit device 106 and interconnect material 360 may be formed to resist separation or delamination during assembly processes, heat treatments, temperature cycle stress, vertical tensile stress, and high Z-axis thermal expansion in surrounding dielectric.

In one instance, circuit 106 and interconnect material 360 are formed by electrolytic plating including the deposition of copper using an external source of electric current. Here, an anode, made from copper, serves as a source of copper ions, where the anode is under a different potential voltage than a cathode (e.g., such as an conductive polymer formed over the surfaces that interconnect material 360 is shown disposed over, formed on, or in, during a pre-treatment process). Thus, copper on or as part of the anode dissolves from the anode into copper ions and migrates to the cathode, and becomes deposited on the dielectric surface (e.g., such as the conductive polymer pre-treatment surface) to form a productive copper layer (e.g., such as to form interconnect material 360 as shown in FIG. 5).

In some cases, an electroplating process for forming circuit 106 and/or interconnect material 360 may involve introducing a substrate or board into an aqueous solution containing metal ions, such as copper sulfate-based solution, and reducing the ions (reducing the oxidation number) to a metallic state by applying current between the substrate or board and an anode of an electroplating cell in the presence of the solution. Thus, such an electrolytic plating may be used to form a sufficient amount of interconnect material 360 onto circuit device 106 and conductive polymer 250 to fill, for example, via opening 108 and trench opening 306, and to form an electrically conductive interconnection to contact surface 102, such as by substantially coating trench sidewalls 377 and 378, trench base 376, via sidewalls 118 and 119, and/or contact surface 102. In addition, interconnect material 360 may be doped, annealed, or radiated, such as is described above with respect to circuit 106 and/or conductive polymer material 250.

According to embodiments, the structures, processes, and techniques described herein may be used for various interconnections, traces, contacts, connections, and electronic conductive conduits within a substrate, circuit device, board or PCB, such as including circuit 106 and interconnect materials 360, 660, and 766 as described herein. In this sense, circuit 106 and the interconnect materials may represent such devices, traces, or interconnections where or to which an electronic interconnection, connection, contact, or trace contact is made.

For instance, it can be appreciated that physical dimensions, materials, manufacturing processes, formation processes, and treatment of circuit 106 and interconnect material 360 may be selected, or performed, such as is described herein, so that those structures form "stacks" or "columns" of conductive contacts and/or interconnections that can "survive" (e.g., such as by "surviving" or avoiding being damaged or delaminated between subsequent layers of conductive contact and/or interconnection material sufficiently to fail at performing their required electrical function) during the life period of a substrate, circuit device, board or PCB, such as including these structures. Hence, circuit 106 and interconnect material 360 may be formed to survive thermal variations and vertical tensile strain expected during manufacture, packaging, attachment, use, repair, maintenance, upgrade, etc. . . . of circuit 106, and devices and structures attached thereto. For instance, circuit 106 and interconnect material 360 may be formed to survive those processes for a period of up to 7 to 10 years of use for the circuit device and structures, by considering the materials, formation processes, sizes, and other factors described above, and the descriptions herein for forming structures of FIGS. 3-5.

Figure 6:
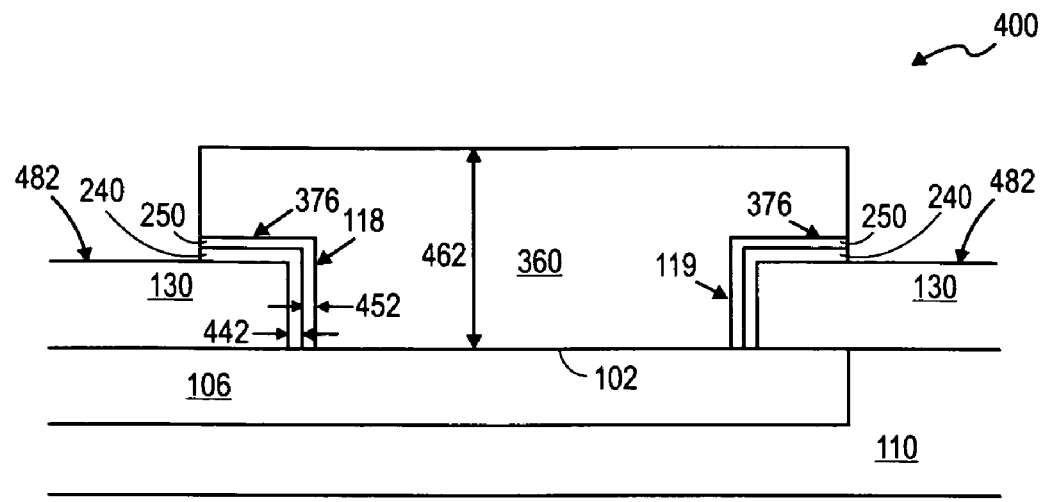
FIG. 6 shows the structure of FIG. 5 after removing the photoresist and portions of the layers of conductive polymer and $MnO_2$ from the surface of the dielectric.

FIG. 6 shows the structure of FIG. 5 after removing the photoresist and portions of the layers of conductive polymer and $MnO_2$ from the surface of the dielectric. FIG. 6 shows structure 300 after photoresist material 380 has been removed, as well as portions of MnO layer 240 and conductive polymer material 250. Specifically, FIG. 6 shows exposed surface 482 of dielectric 130.

For instance, photoresist material 380 as shown in FIG. 5 may be stripped or removed from above, on, over, or overlying exposed surface 482 of dielectric 130. It is contemplated that such stripping or removing may include processes described above with respect to removing or patterning a portion of a photoresist material (e.g., such as photoresist material 380) corresponding to trench opening 306, as described above with respect to FIG. 5.

In addition, portions of $MnO_2$ layer 240 and conductive polymer material 250 may be removed from on, over, overlying, or being disposed above exposed surfaces 482 by etching, such as quick etching, such as with an etch process that includes an $H_2SO_4$ concentrate and/or an $H_2O_2$ concentrate, or other process for removing a conductive polymer material and/or $MnO_2$ layer, as known in the art.

Furthermore, FIG. 6 shows $MnO_2$ layer having thickness 442 of between 0.01 and 1 μm, such as by having a thickness of 0.05 μm, 0.075 μm, 0.1 μm, 0.125 μm, 0.15 μm, or 0.175 μm. Also, FIG. 6 shows conductive polymer material 250 having thickness 452 of between 0.1 μm and 10 μm, such as by having a thickness of 0.25 μm, 0.5 μm, 0.75 μm, 1.0 μm, 1.25 μm, 1.5 μm, or 1.75 μm. Additionally, FIG. 6 shows interconnect material 360 having thickness 462 between 45 μm and 60 μm, such as by having a thickness of 45 μm, 50 μm and 55 μm.

Figure 7:
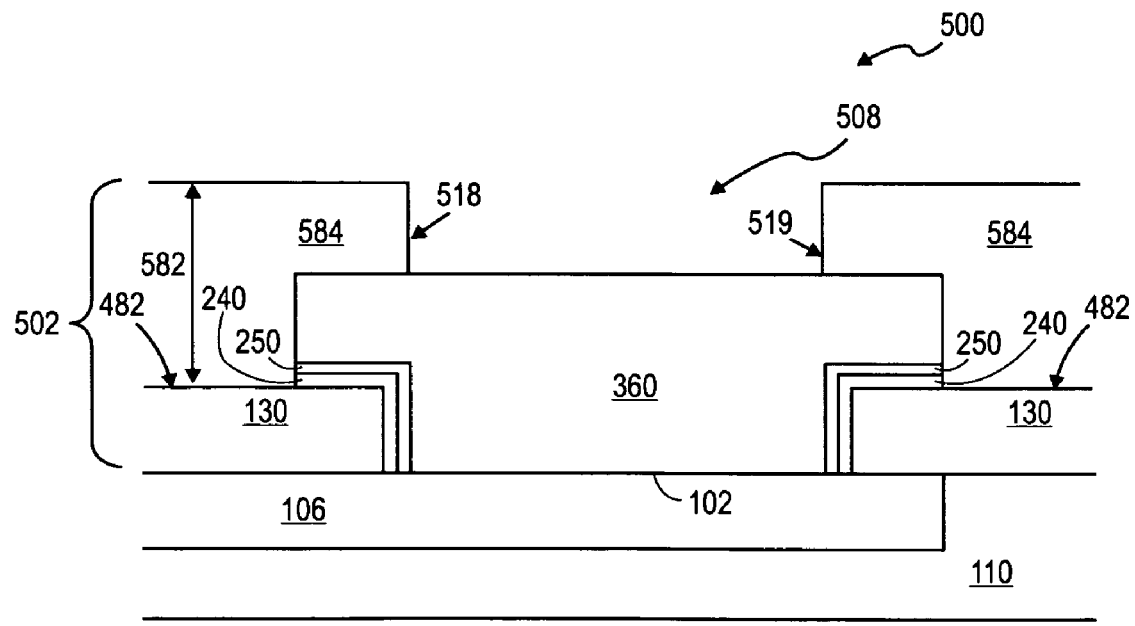
FIG. 7 shows the structure of FIG. 6 after forming an additional layer of dielectric over the dielectric surface and interconnect material, where the additional layer of dielectric has a via opening exposing the interconnect material.

FIG. 7 shows the structure of FIG. 6 after forming an additional layer of dielectric over the dielectric surface and interconnect material, where the additional layer of dielectric has a via opening exposing the interconnect material. FIG. 7 shows dielectric material 584 formed on, over, or overlying exposed surface 482 of dielectric 130. Dielectric material 584 may be formed of a material and/or by a process, such as is described above with respect to dielectric material 130. It is also considered that dielectric material 584 may have thickness 582 such as a thickness greater than via depth 170. Specifically, thickness 582 may be a thickness that has a ratio as compared to via depth 170 of 1.5, 1.75, 1.8, 1.9, 1.95, 2.0, 2.05, 2.1, 2.15, 2.25, or 2.3. In one instance, thickness 582 may be a thickness of between 25 µm and 70 µm, such as by being a thickness of 30 µm, 40 µm, 50 µm or 60 µm.

In addition, it is contemplated that the interface or connection between dielectric material 584 and dielectric material may have a resistance to separation and/or delamination similar to that described above with respect to circuit 106 and interconnect material 360, or for an interface or connection typical for dielectric materials as described herein. In one instance, dielectric material 584 and dielectric material 130 may be the same, or include the same dielectric materials, and/or may be formed by the same, or a similar process.

FIG. 7 also shows via opening 508 in dielectric material 584, having via sidewalls 518 and 519, and to interconnect material 360. According to embodiments, via opening 508 may be formed as described above, have physical dimensions as described above (e.g., such as by having a size, height, width, depth, and/or diameter as described above) with respect to via opening 108. Moreover, via opening 508 may be formed to the surface of interconnect material 360, such as is described above with respect to via opening 108 being formed to contact surface 102, so that interconnect material can be deposited in via opening 508 to form an electrical connection with interconnect material 360, similar to that described above with respect to forming an electrical connection between interconnect material 360 and contact surface 102. Furthermore, via sidewalls 518 and 519 may be sidewalls similar to sidewalls 118 and 119 described above.

FIG. 7 shows structure 502 including dielectric material 584, interconnect material 360, conductive polymer material 250, and MnO$_2$ layer 240, as described herein. It is noted that a structure similar to structure 502 may be subsequently formed on or over structure 500, such as is described above with respect to forming structure 502 on dielectric 130 and circuit 106.

Figure 8:
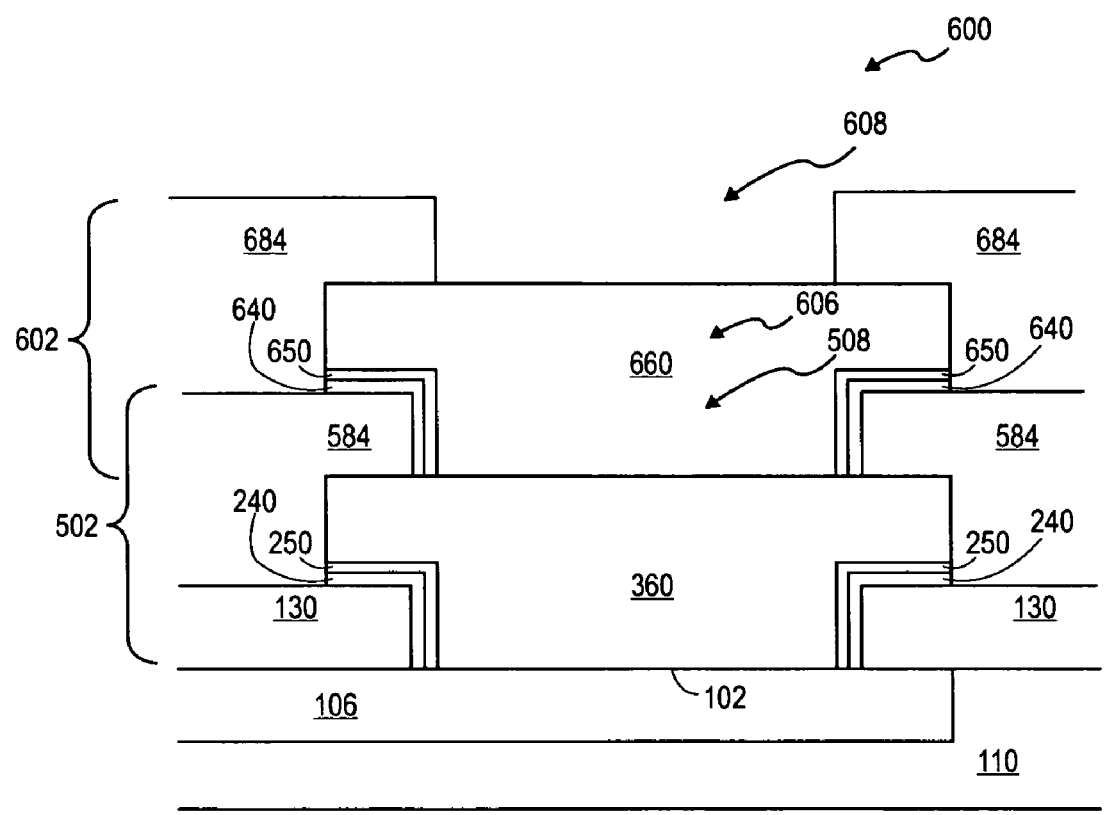
FIG. 8 shows the structure of FIG. 7 after forming another structure similar to the structure of FIG. 8 on the structure shown in FIG. 7.

For example, FIG. 8 shows the structure of FIG. 7 after forming another structure similar to structure 502 of FIG. 7 on structure 500 shown in FIG. 7. FIG. 8 shows structure 600 including structure 602 formed over or on structure 502, such as where structure 602 is a structure similar to structure 502 as described above with respect to FIGS. 3-7. Thus, FIG. 8 shows manganese oxide (MnO$_2$) layer 640 formed on or in dielectric material 584, and conductive polymer material 650 formed on MnO$_2$ layer 640. MnO$_2$ layer 640 may be formed of a material, by a process, doped, annealed, and/or radiated, as described above with respect to MnO$_2$ layer 240. Similarly, conductive polymer material 650 may be formed of a material, by a process, doped, annealed, and/or radiated, such as described above with respect to conductive polymer material 250.

FIG. 8 also shows interconnect material 660 formed in via opening 508 and trench opening 606, on conductive polymer material 650, and to interconnect material 360. Interconnect material 660 may be formed of a material, by a process, doped, annealed, and/or radiated, such as described above with respect to interconnect material 360. Moreover, interconnect material 660 and interconnect material 360 may be formed of a material and by a process as described above with respect to interconnect material 360 and circuit 106 to resist separation or delamination, such as during tensile strain and/or changes of temperature, such as those experienced during manufacture and lifetime of a structure including those interconnect materials, as described above with respect to FIG. 5. Specifically, interconnect material 660 and 360 may be formed by an electrolytic plating process to form a metal to metal adhesion therebetween; may be formed of an electrolytic conductive plating process using a same material including one or more or a metal, a copper, an aluminum, and/or a nickel; and/or may be formed of an electrically conducted material and using a process (e.g., such as a similar electrolytic copper deposition process as described above with respect to FIG. 5). Also, interconnect material 660 and 360 may be formed to have a similar grain structure, mechanical properties, and thermal properties to form a stack or column of contacts or metal interconnects that resist separation or delamination as described herein, such as during manufacture and for a life period of a structure including the interconnect materials.

FIG. 8 also shows via opening 608 in dielectric material 684, having sidewalls, and to interconnect material 360. Via opening 608 may be formed by a process and have physical dimensions such as is described above for via opening 108 and/or via opening 508. Thus, it can be appreciated that one or more additional structures, such as structure 502, may be formed on or above via opening 608 and dielectric material 684, such as is described herein for forming structure 602 on structure 502. As such, it is to be appreciated that a stack or column of interconnect material, such as including interconnect material 660 and 360, can be formed vertically above interconnect material 660 and 360 to form 3, 4, 5, 6, 7, or more structures, such as structure 502 on circuit 106. According to embodiments, via opening 608, or a via opening similar to via opening 608 for a structure, such as structure 502 formed above structure 602, may have a final interconnect material formed in, on, or filling via opening 600 or an opening similar thereto to form a final interconnection or trace, contact, or circuit on structure 600.

Figure 9:
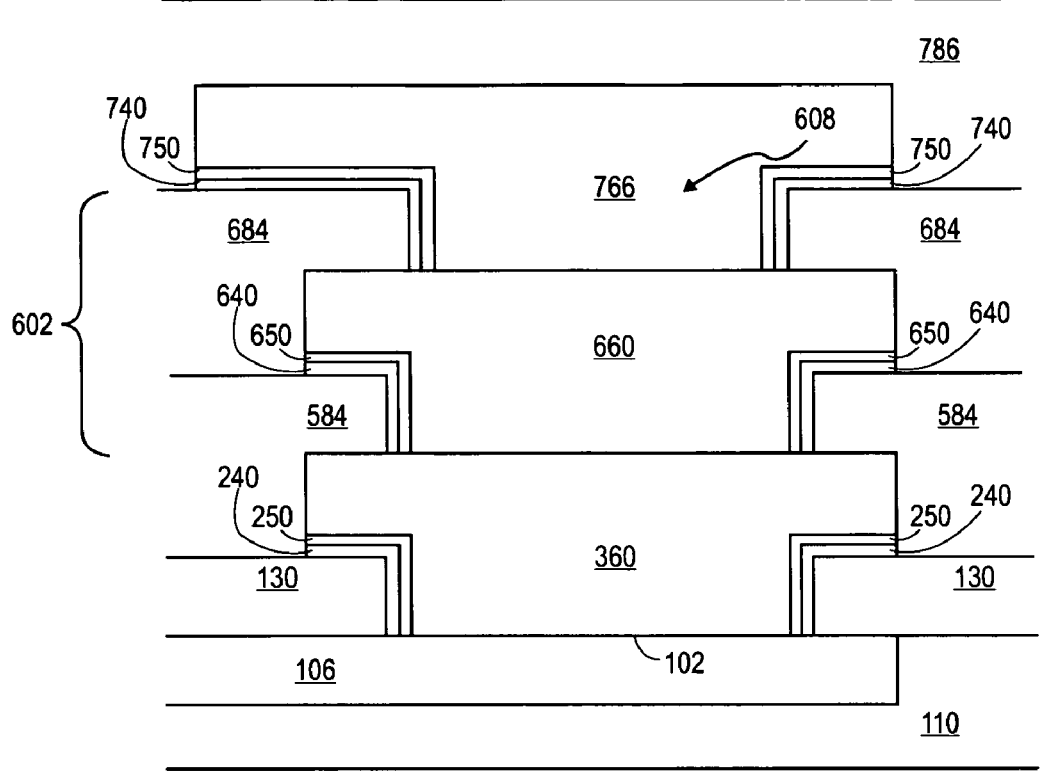
FIG. 9 shows the structure of FIG. 8 after forming a final interconnect material and dielectric solder resist over the structure of FIG. 8.

For example, FIG. 9 shows the structure of FIG. 8 after forming a final interconnect material and dielectric solder resist over the structure of FIG. 8. FIG. 9 shows final interconnect material 766, electrically conductive polymer 750, and MnO$_2$ layer 740 formed in, on, or filling via opening 608 or on structure 602. It is considered that MnO$_2$ layer 740, conductive polymer material 750, and final interconnect material 766 may be formed of a material, by a process, doped, annealed, and/or radiated as described above with respect to MnO$_2$ layer 240, conductive polymer material 750, and interconnect material 360, respectively. Thus, final interconnect material 766 may be attached to, or form an electrical connection to interconnect material 660 that resists separation or delamination, such as is described above with respect to interconnect material 360 and circuit device 106.

FIG. 9 also shows dielectric solder resist 786 formed over or on final interconnect material 766 and dielectric material 684. Dielectric solder resist 786 may be formed of a material, by a process, doped, annealed, and/or radiated, as described above with respect to forming dielectric material 130 and/or dielectric material 110.

In addition, as noted above, it can be appreciated that structure 602 in FIG. 9 may be replaced with multiple structures, such as multiple ones of structure 602 formed or stacked upon each other, such as by being attached and electrically connected or coupled between interconnect material 360 and final interconnect material 766. Thus, structure 602 (e.g., such as a structure including MnO$_2$ layer 640, conductive polymer material 650, interconnect material 660, and dielectric material 684) may represent multiple ones of structure 602 disposed between interconnect material 360 and final interconnect material 766, similarly to how interconnect material 360 is attached and electrically coupled between interconnect material 660 and circuit 106, as described above with respect to FIG. 8.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed:

1. A method comprising:
   electrolytic plating on electrically conductive material; then
   forming a manganese oxide ($MnO_2$) layer on a plurality of via sidewalls of a via opening formed in a dielectric material overlying a circuit having a contact surface and the electrically conductive material, wherein the plurality of via sidewalls extend to the contact surface and the $MnO_2$ layer is not formed on the contact surface;
   forming a conductive polymer material on the manganese oxide layer and not on the contact surface;
   electrolytic plating an interconnect material in the via opening, on the conductive polymer material, and to the contact surface;
   wherein electrolytic plating the interconnect material includes forming an electrolytic metal to electrolytic metal adhesion between the interconnect material and the electrically conductive material.

2. The method of claim 1, wherein forming a manganese oxide ($MnO_2$) layer comprises permanganate etching the dielectric material with a permanganate solution to oxidize a plurality of covalent bonds of the dielectric material.

3. The method of claim 1, wherein forming a conductive polymer material includes:
   using the manganese oxide ($MnO_2$) layer as a catalyst to attach a plurality of dissolved monomers of a conductive polymer material to the $MnO_2$ layer;
   depositing and polymerizing a sufficient number of the monomers on the $MnO_2$ layer to form a solid conductive polymer material on the $MnO_2$ layer.

4. The method of claim 1, wherein the dielectric material is a first dielectric material, the method further comprising:
   forming the first dielectric material on a second dielectric material and the circuit;
   removing a portion of the first dielectric material to form the via opening and the via sidewalls.

5. The method of claim 4, further comprising:
   electrolytic plating an electrically conductive trace material on the second dielectric material to form the circuit device.

6. The method of claim 1, further comprising:
   forming a photoresist material over the dielectric material and over the via opening;
   exposing a portion of the photoresist to light, wherein the portion is beyond a perimeter area adjacent to the via opening;
   removing the photoresist, except the portion, to form a trench opening in the photoresist to the via opening, the trench opening defining a trench base on the dielectric material around the perimeter area.

7. The method of claim 6, further comprising:
   electrolytic plating the interconnect material in the via and trench openings, on the conductive polymer material, on the trench base, and to the contact surface.

8. The method of claim 6, wherein forming the $MnO_2$ layer and forming the conductive polymer material includes forming the $MnO_2$ layer and the conductive polymer material on the dielectric material; the method further comprising:
   stripping the portion of the photoresist;
   etching the $MnO_2$ layer and the conductive polymer material from the dielectric material, except for the perimeter area and the plurality of via sidewalls.

9. The method of claim 1, wherein the dielectric material is a first dielectric material on a second dielectric material and the circuit, the interconnect material is a first interconnect material, the $MnO_2$ layer is a first $MnO_2$ layer, the conductive polymer material is a first conductive polymer material, the method further comprising:
   forming a third dielectric material overlying the first dielectric material, the third dielectric material having a second opening including a plurality of second sidewalls to the first interconnect material;
   forming a second manganese oxide layer on the plurality of second sidewalls;
   forming a second conductive polymer material on the second manganese oxide layer;
   electrolytic plating a second interconnect material in the second opening, on the second conductive polymer material, and to the first interconnect material.

10. The method of claim 9, wherein electrolytic plating the first and second interconnect materials includes forming a metal to metal adhesion between the first and second interconnect materials.

11. The method of claim 9, further comprising one of heating the first and second interconnect materials, thermally treating the first and second interconnect materials, annealing the first and second interconnect materials, and exposing the first and second interconnect materials to a vertical tensile strain.

12. The method of claim 1, wherein electrolytic plating the interconnect material comprises using a same plating process as a process for electrolytic plating the conductive material, and wherein the electrically conductive material and the interconnect material form a continuous electrolytic material stack of electrolytic metal, copper, aluminum or nickel.

13. The method of claim 12, wherein the electrically conductive material and the interconnect material comprise a continuous electrolytic material stack having a same grain structure, mechanical properties, and thermal properties.

14. The method of claim 13, further comprising the electrolytic material stack resisting separation and delamination during tensile strain in a vertical direction.

15. The method of claim 1 wherein electrolytic plating the interconnect material comprises using a similar plating process as a process for electrolytic plating the conductive material.

16. The method of claim 15 wherein the electrically conductive material and the interconnect material form a continuous electrolytic material stack of electrolytic metal, copper, aluminum or nickel.

* * * * *